(12) United States Patent
Liu

(10) Patent No.: US 12,429,510 B2
(45) Date of Patent: Sep. 30, 2025

(54) SPHERICAL SCANNING TYPE ANTENNA MEASUREMENT SYSTEM AND SIGNAL TRANSMISSION MECHANISM THEREOF

(71) Applicant: WAVEPRO INCORPORATED, Taoyuan (TW)

(72) Inventor: Rong-Chung Liu, Taoyuan (TW)

(73) Assignee: WAVEPRO INCORPORATED, Taoyuan (TW)

( * ) Notice: Subject to any disclaimer, the term of this patent is extended or adjusted under 35 U.S.C. 154(b) by 217 days.

(21) Appl. No.: 18/474,321

(22) Filed: Sep. 26, 2023

(65) Prior Publication Data

US 2024/0110961 A1    Apr. 4, 2024

(30) Foreign Application Priority Data

Sep. 28, 2022   (TW) ................................. 111136771

(51) Int. Cl.
*G01R 29/08*  (2006.01)
*H01Q 3/06*   (2006.01)

(52) U.S. Cl.
CPC ........... *G01R 29/0878* (2013.01); *H01Q 3/06* (2013.01)

(58) Field of Classification Search
CPC ....... G01R 29/08; G01R 29/0878; H01Q 3/06
See application file for complete search history.

(56) References Cited

U.S. PATENT DOCUMENTS 10,085,162 B2 *  9/2018  Foegelle ............... G01R 29/105
11,594,803 B2 *  2/2023  Gierow .................. H01Q 1/082

FOREIGN PATENT DOCUMENTS

CN        107643452 A      1/2018

OTHER PUBLICATIONS

Sanandiya, et al.: "Definition, Implementation, and Evaluation of a Novel Spiral-Sampling Technique"; https://www.nsi-mi.com/images/Technical_Papers/2020/Definition-Implementation-and-Evaluation-of-a-Novel-Spiral-Sampling-Technique.pdf; published in 2020.

* cited by examiner

*Primary Examiner* — Eman A Alkafawi
*Assistant Examiner* — Suresh K Rajaputra
(74) *Attorney, Agent, or Firm* — McClure, Qualey & Rodack, LLP

(57) ABSTRACT

A signal transmission mechanism includes a first cable carrying arm, a second cable carrying arm and a pivoting module. The first connecting portion and the second connecting portion are connected through the pivoting module so that the first cable carrying arm and the second cable carrying arm can be rotated with respect to each other. The first cable carrying arm is configured to carry a first cable and the second cable carrying arm is configured to carry a second cable. The first cable and the second cable are electrically connected through the pivoting module. A signal is transmitted from the first cable through the pivoting module to the second cable. The first cable and the second cable are not deformed when the first cable carrying arm and the second cable carrying arm are rotated with respect to each other.

10 Claims, 11 Drawing Sheets

SPHERICAL SCANNING TYPE ANTENNA MEASUREMENT SYSTEM AND SIGNAL TRANSMISSION MECHANISM THEREOF

CROSS REFERENCE TO RELATED APPLICATIONS

This application claims the right of priority under 35 U.S.C. § 119 of Taiwan Patent Application TW111136771 filed on Sep. 28, 2022, which is incorporated by reference herein in its entirety.

BACKGROUND OF THE INVENTION

Field of the Invention

The invention relates to a technical field of an equipment for measuring the antenna characters, and more particularly to a spherical scanning type antenna measurement system and its signal transmission mechanism that are able to avoid the cables from bending or twisting so that the signals transmitted in the cables are not distorted.

Description of the Related Art

The measurement of antenna characteristics mainly includes measurement of the gain and field strength of the antenna in all directions, and determination of horizontal polarization and vertical polarization characteristics of the antenna. At present, the measurement methods of antenna characteristics are mainly classified into far-field measurement method, compact field measurement method and near-field measurement method. The traditional far-field measurement method is directly performed indoors or outdoors in an open atmospheric environment. However, this method is easily affected by other electromagnetic waves or weather conditions. The advantage of the far-field measurement method is that the characteristic data of the antenna can be directly obtained.

As compared to the far-field measurement method, the compact field measurement method is performed at a reduced distance. Specifically, the compact field measurement method is performed in an anechoic chamber, in which a metal reflector with a parabolic surface is used to reflect the spherical signal emitted by a feed source for producing a planar signal and forming a quiet zone at a predetermined distance. The compact field measurement method is disclosed in, for example, TW M614710 filed with Taiwan Intellectual Property Office (TIPO) by the Applicant on Mar. 16, 2021 and issued on Jul. 21, 2021. Because the compact field measurement method is performed in an anechoic chamber, the measurement results are less affected by other electromagnetic waves or weather conditions. To perform the compact field measurement method, however, a high-precision mechanical processing equipment is required. During measurement, changing the working frequency band by replacement of the feed source is also required. Therefore, the cost for measurement in accordance with the compact field measurement method is high.

The near-field measurement method prevails in recent years. In an anechoic chamber, a measurement surface disposed in the vicinity of the antenna is scanned to obtain the signal amplitude and the phase distribution for multi discrete points on the measurement surface. Then, the characters of the antenna in the far field can be obtained by using the unfolded theory. The above measurement surface may be planar, cylindrical or spherical. Accordingly, the near-field measurement equipments are generally classified into planar near-field measurement equipment, cylindrical near-field measurement equipment, and spherical near-field measurement equipment.

An example of the near-field measurement equipment is the spherical near-field scanner system designed and produced by NSI-MI Technologies under the AMETEK group. The spherical near-field scanner system includes a circularly curved test frame which is rotatable about an $\varphi$ axis, and an antenna carrier which is disposed on and movable along the circularly curved test frame. By such arrangement, the antenna carrier during movement is rotated about a $\theta$ axis that passes through the circular center of the circularly curved test frame, and the test antenna carried by the antenna carrier is able to measure multi locations on a spherical surface corresponding to the test source or the probe antenna disposed at the circular center of the circularly curved test frame.

In the above spherical near-field scanner system, the cable for transmitting the measurement signal or the control signal is configured to directly connect the control end and the antenna carrier. Therefore, when the antenna carrier is moved along the circularly curved test frame, the cable may be bent or twisted so that the transmitted signal is distorted and the measurement result is incorrect.

BRIEF SUMMARY OF THE INVENTION

An object of the invention is to provide a spherical scanning type antenna measurement system and its signal transmission mechanism to address the above issue. In the invention, two cables are used to substitute the traditional cable. The two cables are disposed in a signal transmission mechanism that includes two cable carrying arms rotatably connected to each other. Further, the two cables are electrically connected at the pivot where the two cable carrying arms are connected. Such arrangement can protect the two cables from bending or twisting so that transmission of the signal is stable.

The signal transmission mechanism in accordance with an exemplary embodiment of the invention includes a first cable carrying arm, a second cable carrying arm and a pivoting module. The first cable carrying arm includes a first main body and a first connecting portion wherein the first main body includes a first end and a second end, and the first connecting portion is disposed at the first end. The second cable carrying arm includes a second main body and a second connecting portion wherein the second main body includes a third end and a fourth end, and the second connecting portion is disposed at the third end. The pivoting module is connected to the first connecting portion and the second connecting portion so that the first cable carrying arm and the second cable carrying arm can be rotated with respect to each other. The first cable carrying arm is configured to carry a first cable and the second cable carrying arm is configured to carry a second cable. The first cable and the second cable are electrically connected through the pivoting module. A signal is transmitted from the first cable through the pivoting module to the second cable. The first cable and the second cable are not deformed when the first cable carrying arm and the second cable carrying arm are rotated with respect to each other.

In another exemplary embodiment, the second end of the first cable carrying arm is fixedly disposed, and the fourth end of the second cable carrying arm is movable at a linear trajectory or at a curved trajectory.

In yet another exemplary embodiment, the pivoting module includes a mechanically pivoting structure and a first electrically pivoting structure. The first connecting portion and the second connecting portion are rotatably connected through the mechanically pivoting structure. The first cable and the second cable are rotatably connected through the first electrically pivoting structure.

In another exemplary embodiment, the mechanically pivoting structure includes a bearing. The bearing includes an inner ring and an outer ring. The outer ring is connected to the first connecting portion. The inner ring is connected to the second connecting portion.

In yet another exemplary embodiment, the mechanically pivoting structure further includes a connecting element. The connecting element connects the inner ring of the bearing and the second connecting portion so that the connecting element is rotated together with the inner ring of the bearing and the second connecting portion synchronously. The connecting element includes an inner space in which the first electrically pivoting structure is disposed.

In another exemplary embodiment, the first electrically pivoting structure includes a first electrical connector, a second electrical connector and a rotatable coupler. The rotatable coupler includes a coupler body, a first protruding end and a second protruding end. The first protruding end and the second protruding end are extended from the coupler body in opposite directions. The coupler body is disposed at the second connecting portion. The first electrical connector is connected to the first cable and is rotatably coupled to the first protruding end. The second electrical connector is connected to the second cable and is rotatably coupled to the second protruding end.

In yet another exemplary embodiment, the first cable carrying arm includes a first cable channel to contain the first cable. The first cable channel is connected to the first connecting portion. The second cable carrying arm includes a second cable channel to contain the second cable. The second cable channel is connected to the second connecting portion.

The spherical scanning type antenna measurement system in accordance with an exemplary embodiment of the invention includes a measurement frame, an antenna carrier and the above-mentioned signal transmission mechanism. The measurement frame includes a frame body and a pivot portion. The antenna carrier configured to carry an antenna and movably disposed on the frame body of the measurement frame. The second end of the first cable carrying arm is fixed to the measurement frame and the fourth end of the second cable carrying arm is connected to the antenna carrier. The frame body is circularly curved and is disposed corresponding to a circular center, and the pivot portion is connected to the frame body. The pivot portion is rotatable about a first axis. A second axis is configured to pass through the circular center and is disposed perpendicular to the frame body. The first axis and the second axis are perpendicular to each other and intersect at the circular center. The antenna carrier is movable along the frame body at a circularly curved trajectory.

In another exemplary embodiment, the pivoting module of the signal transmission mechanism is disposed in the second axis.

In yet another exemplary embodiment, the spherical scanning type antenna measurement system further includes a stand disposed on a base plane, wherein the pivot portion of the measurement frame is rotatably connected to the stand, and the first axis is disposed in parallel to the base plane.

DETAILED DESCRIPTION OF THE INVENTION

Figure 1:
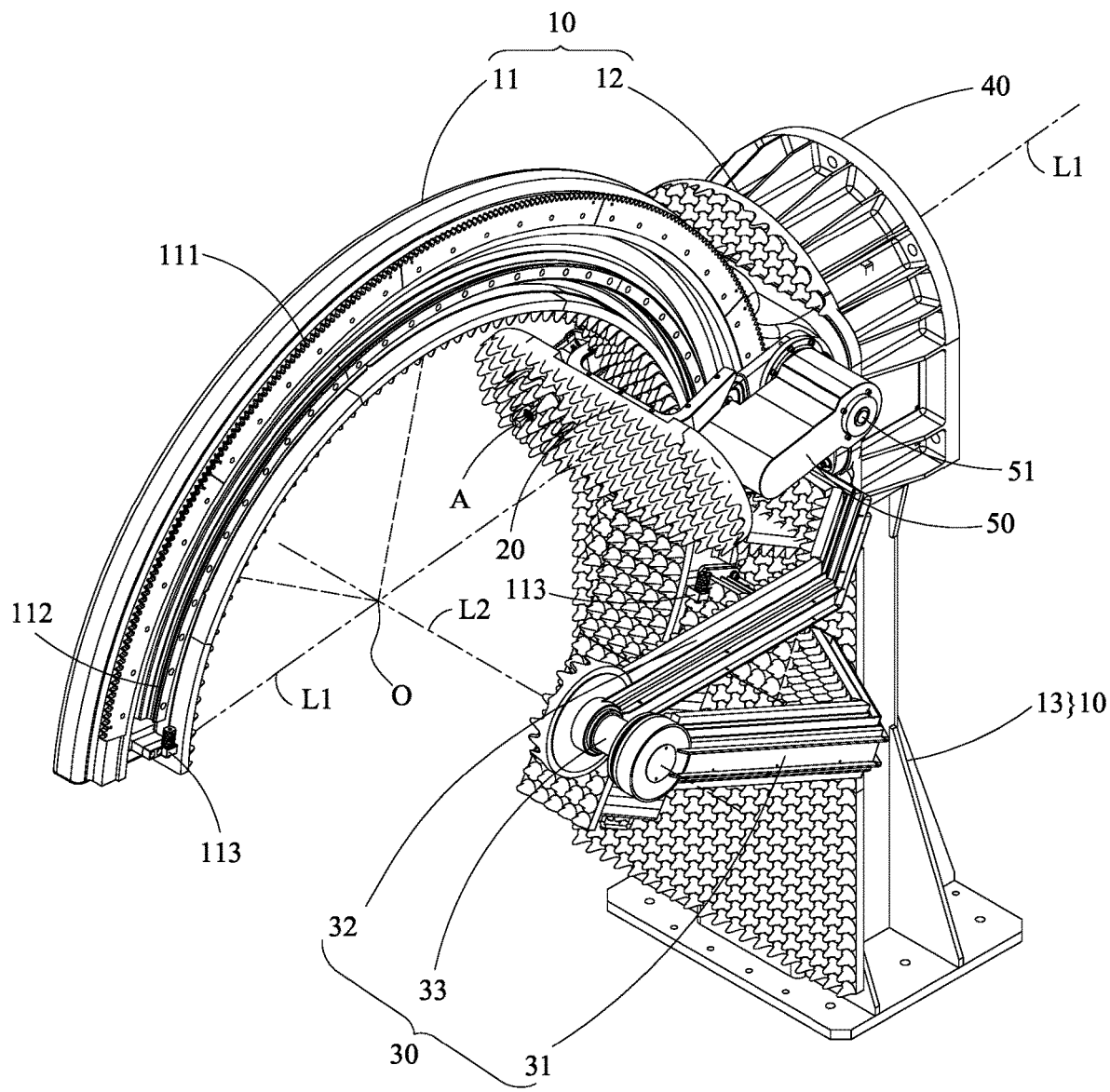
FIG. 1 is a perspective view of a spherical scanning type antenna measurement system in accordance with an embodiment of the invention.
Figure 2:
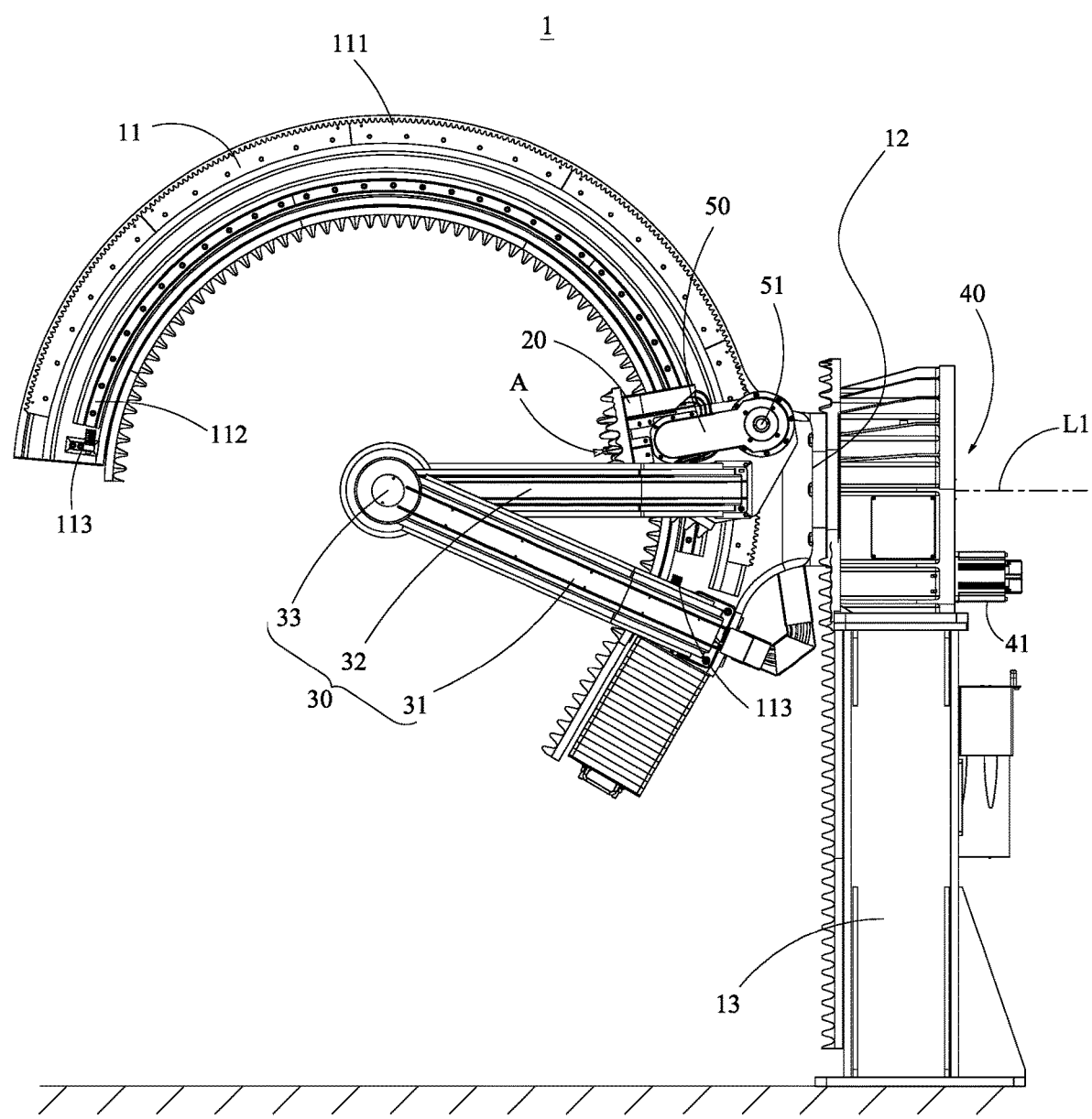
FIG. 2 is a front view of a spherical scanning type antenna measurement system of FIG. 1, wherein the signal transmission mechanism is in a folded state.
Figure 3:
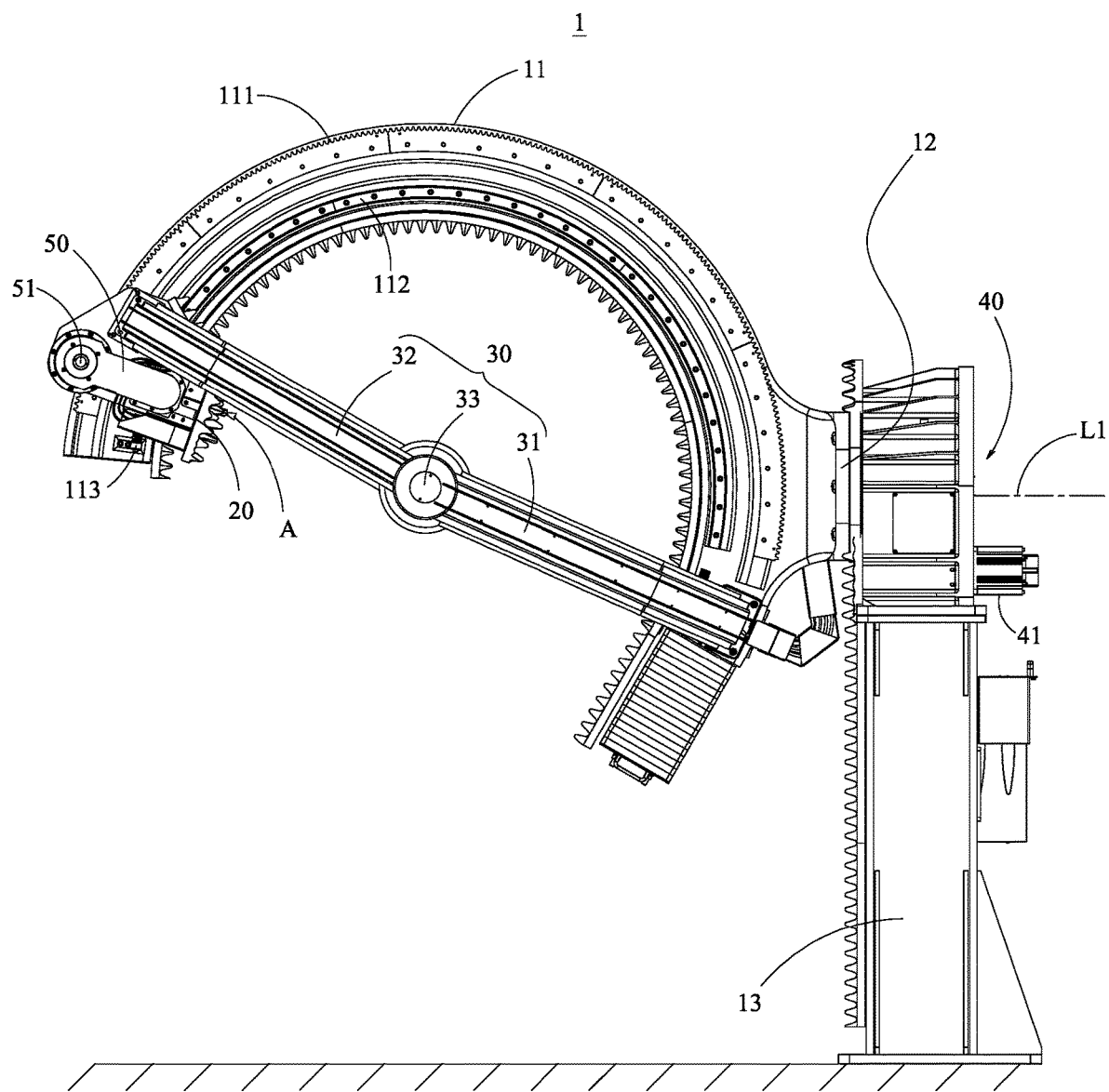
FIG. 3 is a front view of a spherical scanning type antenna measurement system of FIG. 1, wherein the signal transmission mechanism is in an extended state.
Figure 4:
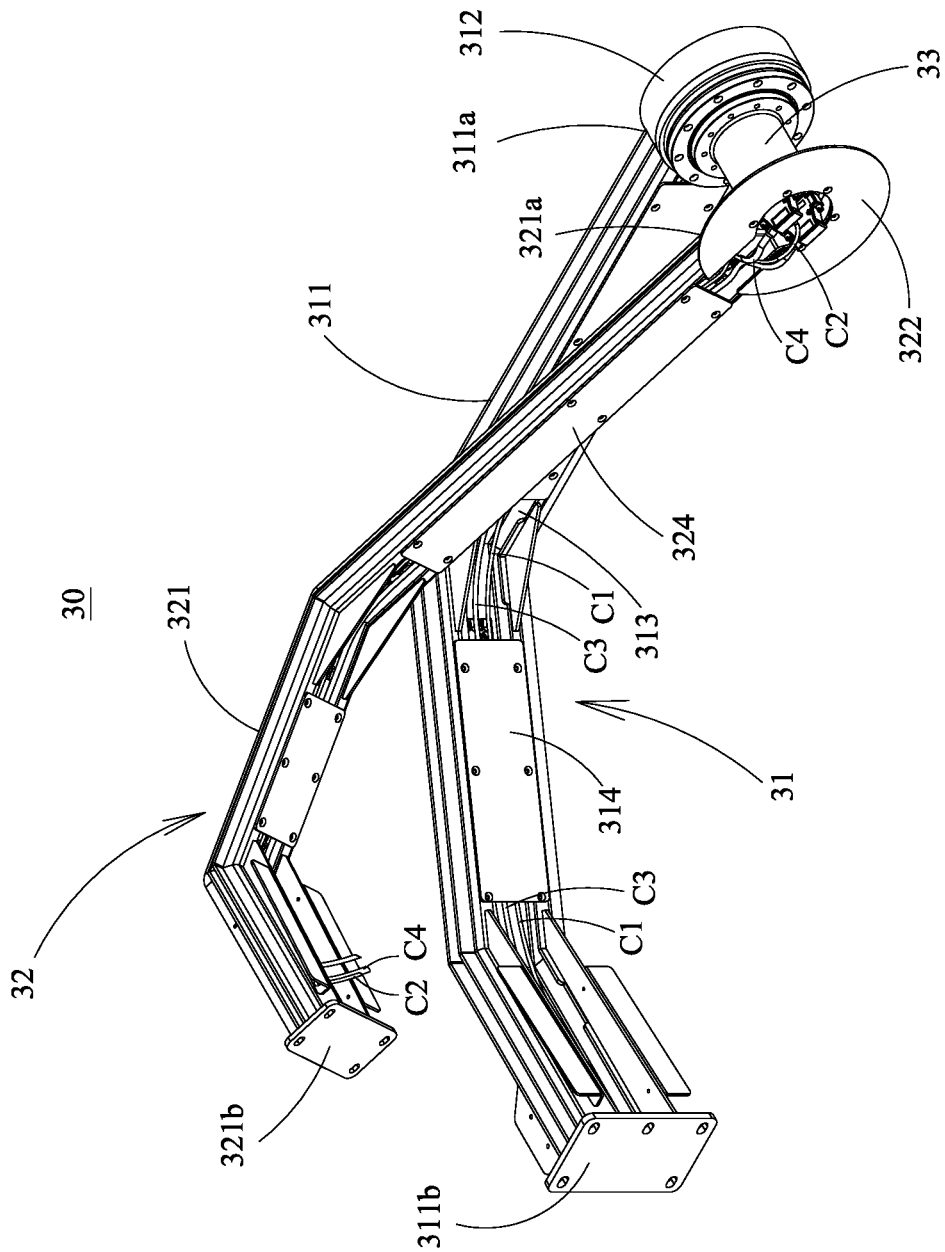
FIG. 4 is a perspective view of a signal transmission mechanism in accordance with an embodiment of the invention, wherein the signal transmission mechanism is in a folded state.
Figure 5:
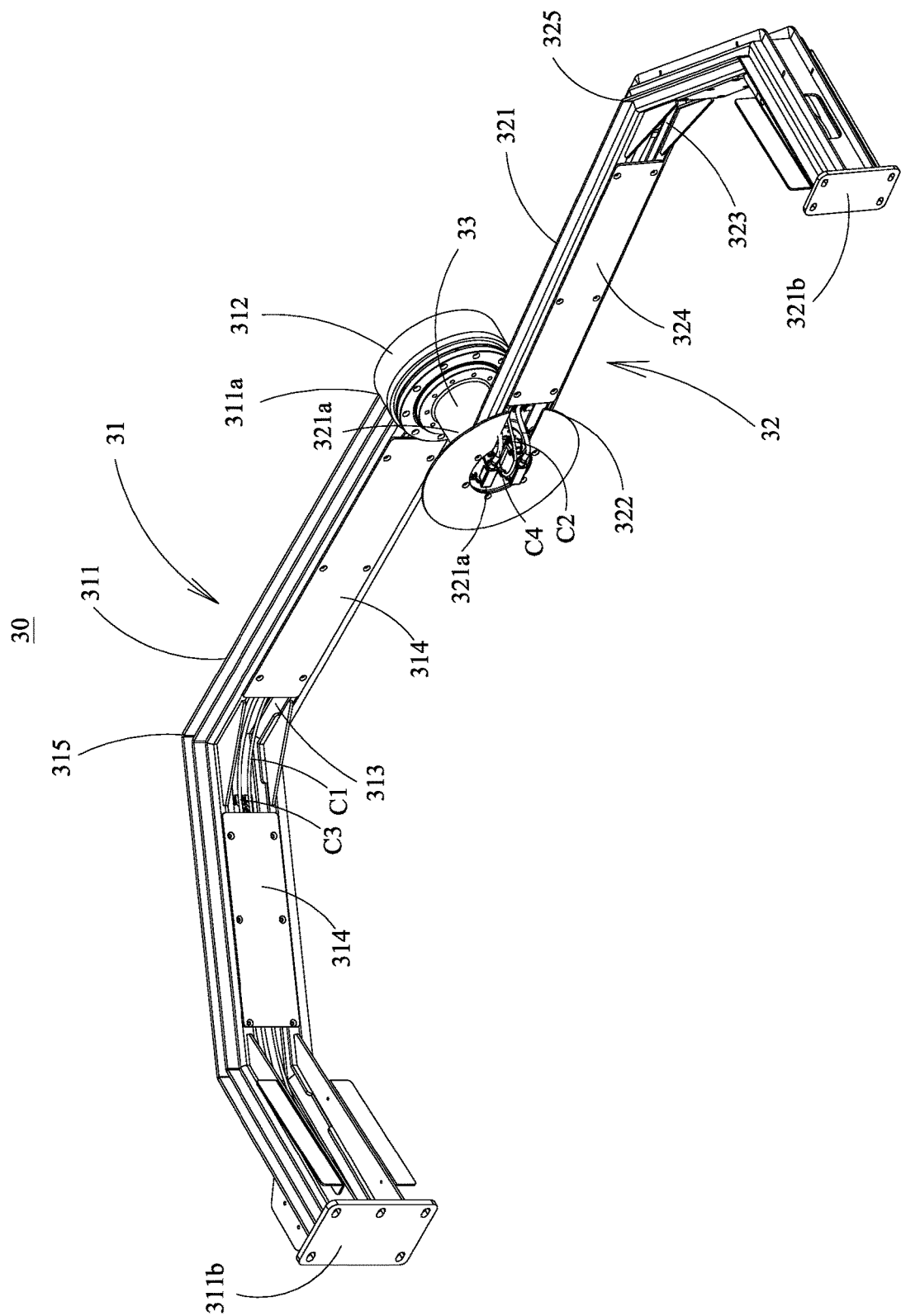
FIG. 5 is another perspective view of the signal transmission mechanism of FIG. 4, wherein the signal transmission mechanism is in an extended state.

Referring to FIGS. 1, 2, 3, 4 and 5, a spherical scanning type antenna measurement system and the signal transmission mechanism thereof in accordance with an embodiment of the invention are shown. In this embodiment, the spherical scanning type antenna measurement system 1 includes a measurement frame 10, an antenna carrier 20 and a signal transmission mechanism 30.

The measurement frame 10 includes a frame body 11, a pivot portion 12 and a stand 13. The frame body 11 is circularly curved and has a corresponding circular center O. The pivot portion 12 is connected to the frame body 11. In this embodiment, the pivot portion 12 and the frame body 11 are integrally formed as a continuous-unity structure. The stand 13 is disposed on a base plane. The base plane may be the ground of a test field. In this embodiment, the stand 13 is disposed upright on the base plane. The pivot portion 12 is a shaft fitted to a shaft hole of the stand 13 and is rotatable about a first axis L1. Accordingly, the frame body 11, integrally formed with the pivot portion 12, is also rotatable about the first axis L1. The first axis L1 is an $\varphi$ axis of a spherical coordinate system established for measurement of the antenna characteristics. The spherical scanning type antenna measurement system 1 of this embodiment further includes a first driving device 40 disposed on the stand 13. The first driving device 40 includes a first servo motor 41 and a first gear set (not shown). The first servo motor 41 is connected to the pivot portion 12 through the first gear set. By controlling rotation of the first servo motor 41, the circularly curved frame body 11 can be driven to rotate along with the pivot portion 12 to a desired azimuth angle $\varphi$.

A second axis L2 is defined in this embodiment that passes through the circular center O and is perpendicular to the frame body 11. The first axis L1 and the second axis L2 are perpendicular to each other and intersect at the circular center O. The antenna carrier 20 is movably disposed on the frame body 11 of the measurement frame 10. During measurement, the antenna carrier 20 is moved along the frame body 11. Therefore, the trajectory of the moving antenna carrier 20 is circularly curved. In other words, the antenna carrier 20 is rotatable about the second axis L2, where the second axis L2 is a θ axis of the spherical coordinate system established for measurement of the antenna characteristics. The spherical scanning type antenna measurement system 1 of this embodiment further includes a second driving device 50 disposed on the antenna carrier 20. The second driving device 50 includes a second servo motor 51 and a second gear set (not shown). The frame body 11 is provided with a curved gear rack 111 and a curved guiding track 112. Both of the curved gear rack 111 and the curved guiding track 112 are extended along the frame body 11, have the same curvature as the frame body 11, and are disposed corresponding to the circular center O. The second gear set is disposed to mesh with the curved gear rack 111. Therefore, the antenna carrier 20 can be driven by the second servo motor 51 through the second gear set and the curved gear track 111 to rotate about the second axis L2 and move along the curved track 112 to a desired polar angle θ. The curved track 112 has limit switches 113 at both ends. When the antenna carrier 20 is moved to an end of the curved track 112 so as to actuate the limit switch 113, the second servo motor 51 is stopped from operation. In this embodiment, the curved track 112 is semicircular and therefore has a central angle of 180°. At any azimuth angle gyp, the antenna carrier 20 can be moved within 180° of polar angle θ with respect to the second axis L2.

The spherical scanning type antenna measurement system 1 further includes a test antenna and a probe antenna, one of which can be disposed on the antenna carrier 20, and the other of which can be disposed at the circular center O. The circular center O is a spherical center for the spherical scanning type antenna measurement system 1 to perform a spherical scan. Specifically, the probe antenna is disposed at the circular center O to emit electromagnetic waves, and the test antenna A is disposed on the antenna carrier 20 to receive the electromagnetic waves so as to measure the characteristics of the test antenna in the near field. Alternatively, the test antenna is disposed at the circular center O to emit electromagnetic waves, and the probe antenna is disposed on the antenna carrier 20 to receive the electromagnetic waves so as to measure the characteristics of the test antenna in the near field. During measurement, the frame body 11 of the spherical scanning type antenna measurement system 1 is rotated about the first axis L1 (φ axis) and the antenna carrier 20 is moved with respect to the second axis L2 (θ axis) so that the test antenna A can receive the electromagnetic waves from the probe antenna (the signal source) at a plurality of discrete measuring points. If the electromagnetic wave signals are reflected by the surfaces of the measurement frame 10 and the antenna carrier 20 to the test antenna or the probe antenna disposed at the circular center O, then the measurement result will be incorrect. To avoid such reflections, all the surfaces of the measurement frame 10 and the antenna carrier 20 facing the circular center O are provided with protrusions (conical, pyramidical, wedged or the like) which are made of or coated with electromagnetic wave absorbing material to absorb the electromagnetic wave signal and avoid the reflections of the electromagnetic wave signal.

The test antenna or the probe antenna is disposed on the antenna carrier 20, and the second driving device 50 is also disposed on the antenna carrier 20. Therefore, the signal feed cable of the test antenna or the signal measurement cable of the probe antenna is extended from the control end to the antenna carrier 20. Also, the control signal cable for transmitting the control signal of the second driving device 50 is extended from the control end to the antenna carrier 20. In this embodiment, the signal transmission mechanism 30 is configured to transmit the control signal from the control end to the second driving device 50 disposed on the antenna carrier 20, and to transmit the signal data from the test antenna disposed on the antenna carrier 20 to the control end.

Figure 6:
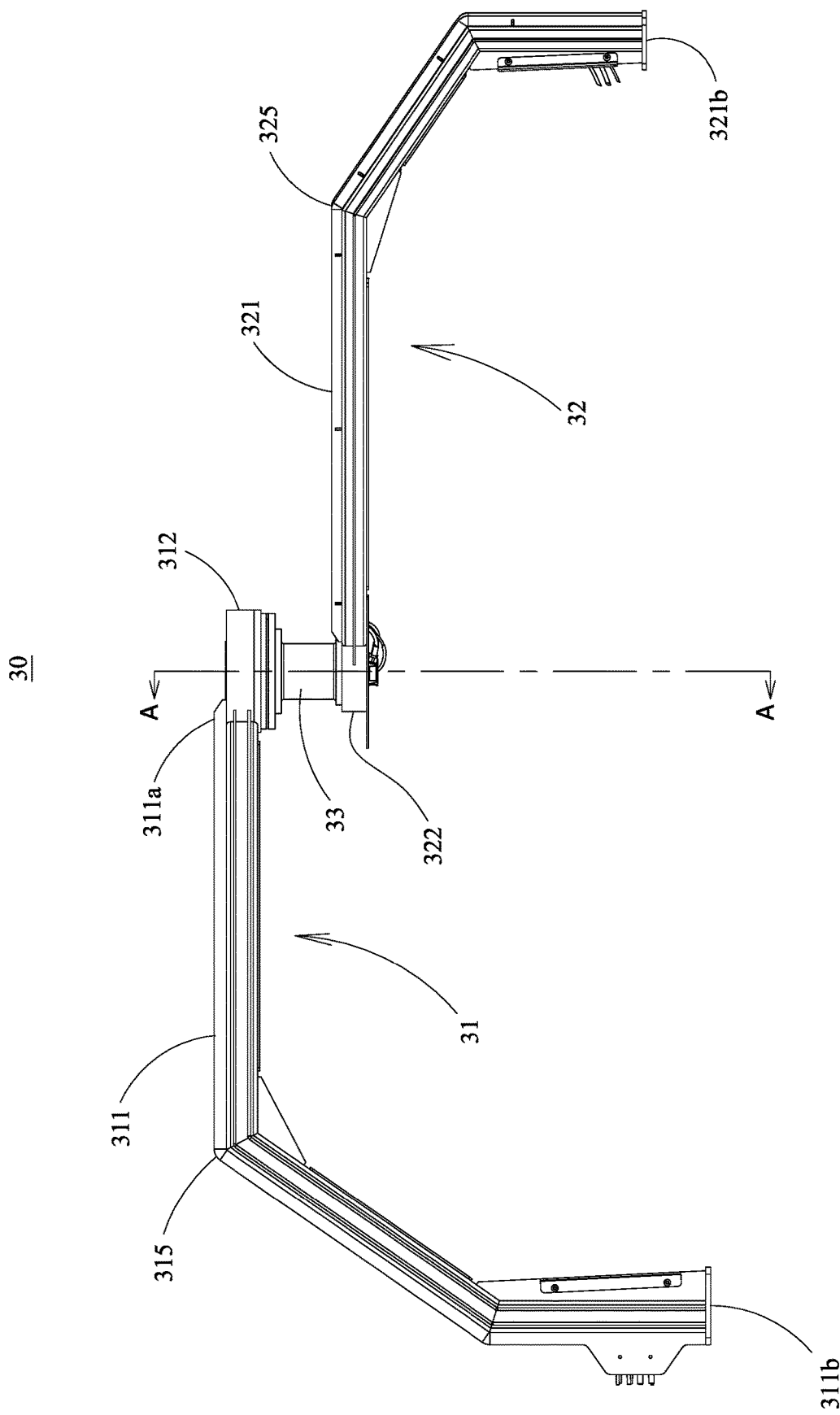
FIG. 6 is a front view of the signal transmission mechanism of FIG. 4.
Figure 7:
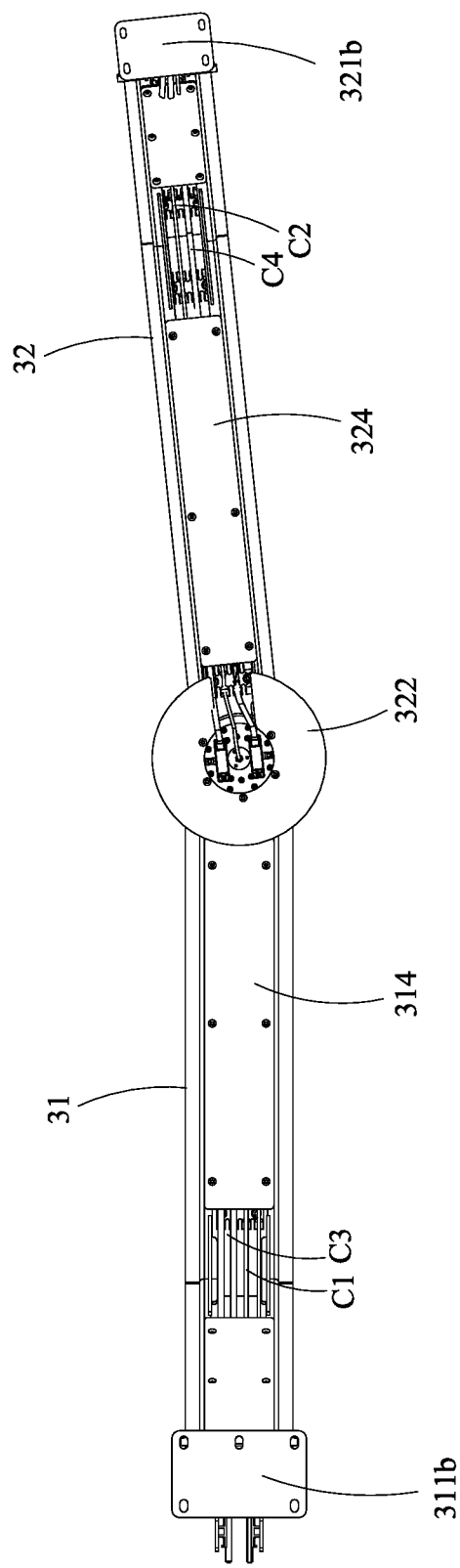
FIG. 7 is a top view of the signal transmission mechanism of FIG. 4.
Figure 8:
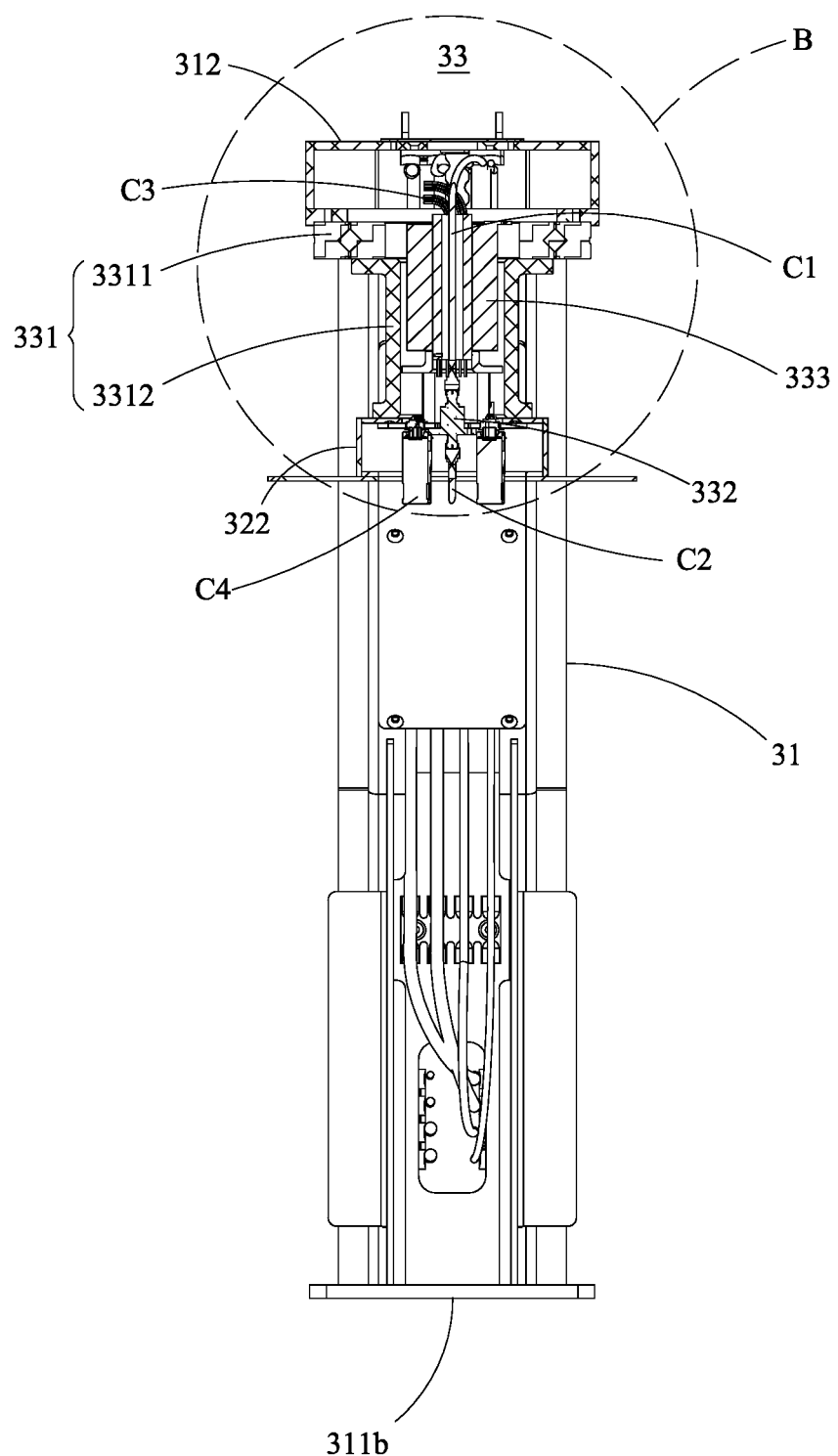
FIG. 8 is a sectional view of FIG. 6 along line A-A.
Figure 9:
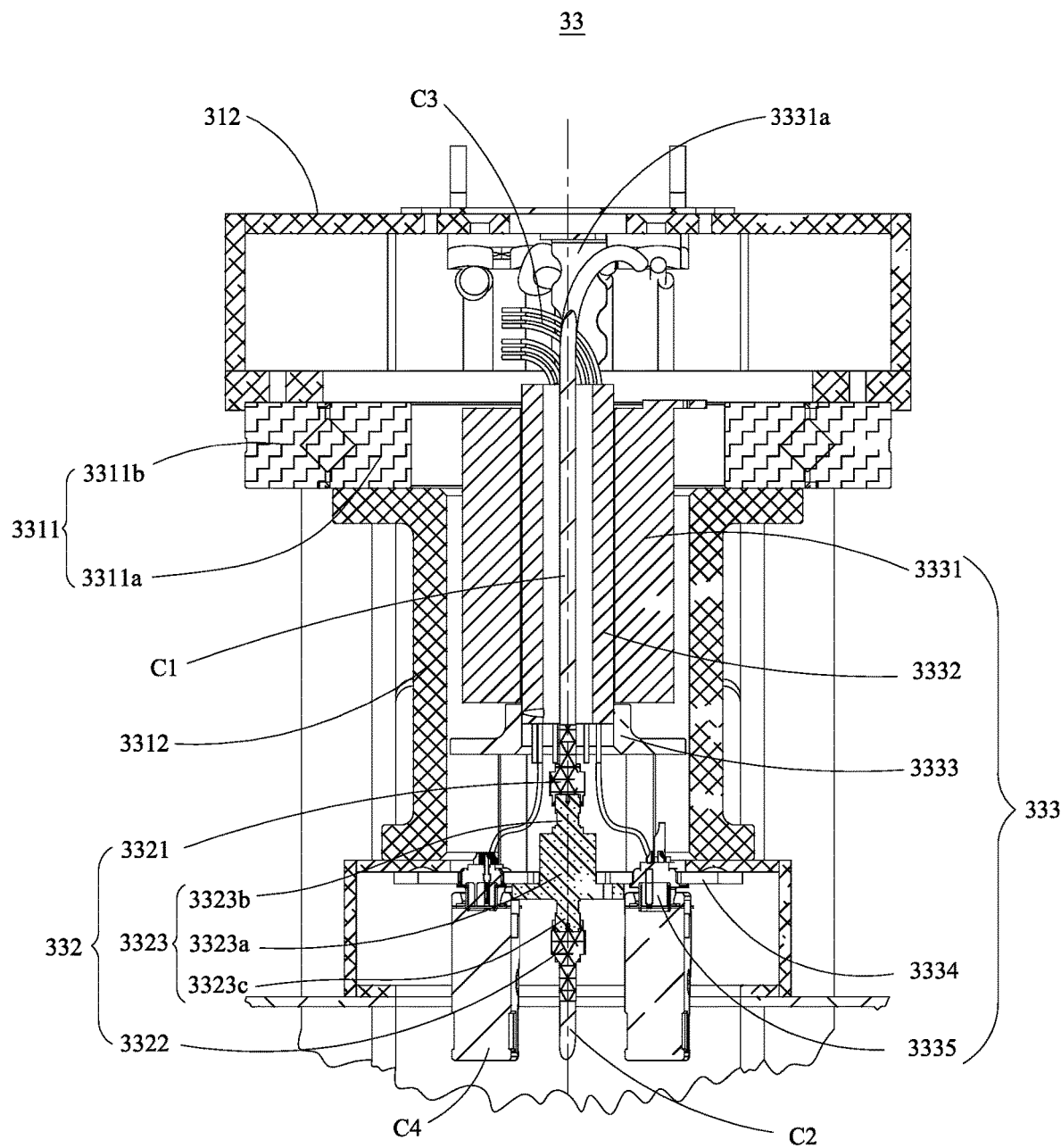
FIG. 9 is an enlarged local view of portion B of FIG. 8.
Figure 10:
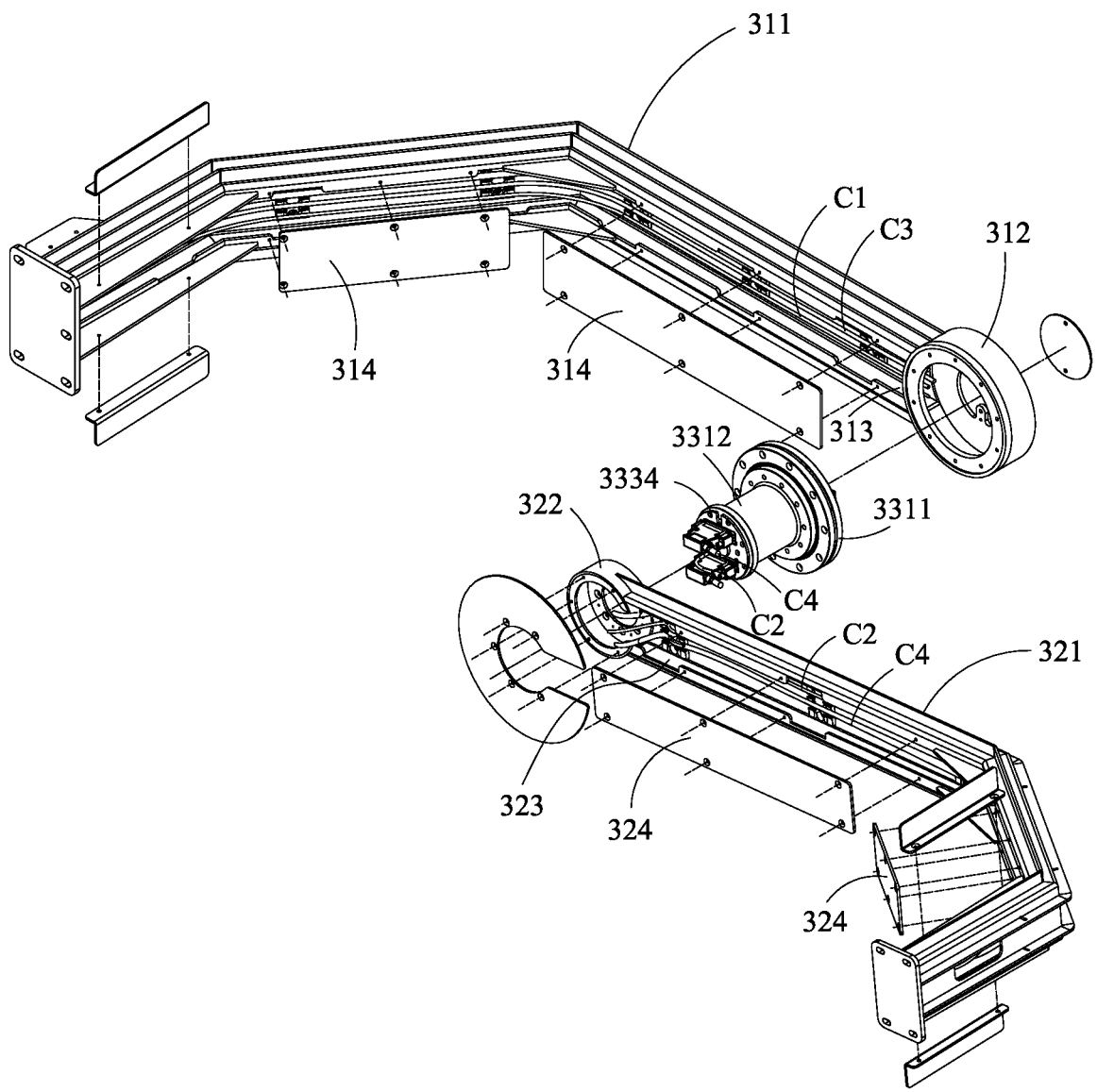
FIG. 10 is an exploded perspective view of the signal transmission mechanism of FIG. 4.
Figure 11:
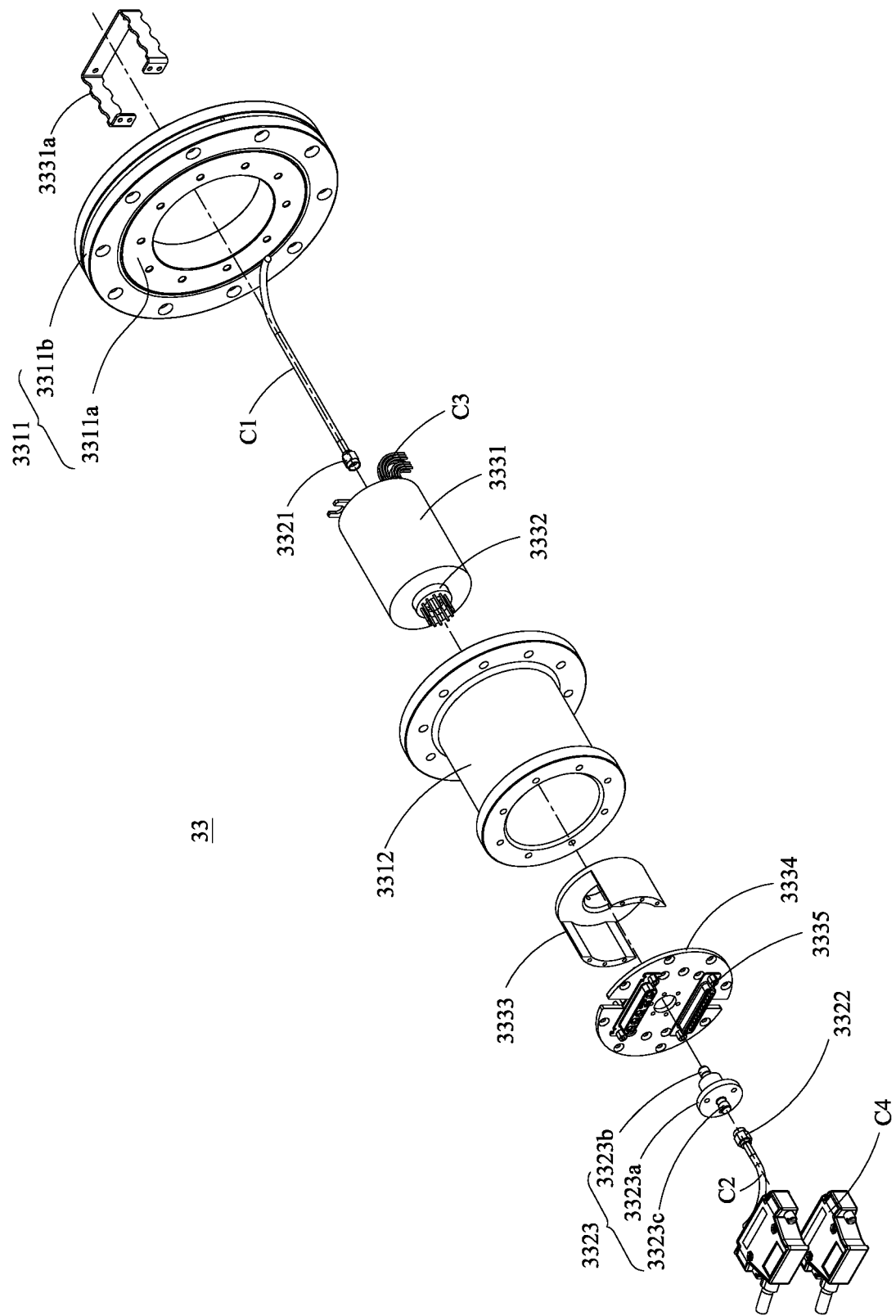
FIG. 11 is an exploded perspective view of the pivoting module of the signal transmission mechanism of FIG. 10.

Referring to FIGS. 6, 7, 8, 9, 10 and 11, the signal transmission mechanism 30 of this embodiment includes a first cable carrying arm 31, a second cable carrying arm 32 and a pivoting module 33. The first cable carrying arm 31 is configured to carry a first cable C1. The second cable carrying arm 32 is configured to carry a second cable C2. In this embodiment, the first cable C1 and the second cable C2 are radio frequency (RF) signal cables for transmitting the measurement signal of the test antenna.

The first cable carrying arm 31 includes a first main body 311 and a first connecting portion 312. The first main body 311 is oriented lengthwise and includes a first end 311a and a second end 311b. The first connecting portion 312, disposed at the first end 311a, is a ring-shaped structure for connection to the pivoting module 33. The first main body 311 has a first cable channel 313 to contain the first cable C1, and a plurality of first cover plates 314 to partially cover the first cable channel 313 for keeping the first cable C1 in the first cable channel 313. The first cable channel 313 is connected to the first connecting portion 312. The first cable C1 is extended from the first cable channel 313 to the first connecting portion 312. Further, the first cable C1 is extended through the second end 311b to the control end. The second end 311b is fixed to the frame body 11 of the measurement frame 10, capable of keeping the first cable C1 in position at the second end 311b and preventing the first cable C1 from bending or twisting.

The second cable carrying arm 32 includes a second main body 321 and a second connecting portion 322. The second main body 321 is oriented lengthwise and includes a third end 321a and a fourth end 321b. The second connecting portion 322, disposed at the third end 321a, is a ring-shaped structure for connecting to the pivoting module 33. The fourth end 321b is connected to the antenna carrier 20 and is moved together with the antenna carrier 20 along the frame body 11. Therefore, the trajectory of the moving fourth end 321b is also circularly curved. The second main body 321 has a second cable channel 323 to contain the second cable C2, and has a plurality of second cover plates 324 to partially cover the second cable channel 323 for keeping the second cable C2 in the second cable channel 323. The second cable channel 323 is connected to the second connecting portion 322. The second cable C2 is extended from the second cable channel 323 to the second connecting portion 322. Further, the second cable C2 is extended through the fourth end 321b to the antenna carrier 20 and is connected to the test antenna A. The fourth end 321b is fixed to the antenna carrier 20, capable of keeping the second cable C2 in position at the fourth end 321b and preventing the second cable C2 from bending or twisting.

The pivoting module 33 is configured to connect the first connecting portion 312 and the second connecting portion 322, allowing the first cable carrying arm 31 and the second cable carrying arm 32 to rotate with respect to each other. Further, the first cable C1 and the second cable C2 are electrically connected to each other through the pivoting module 33. Therefore, the RF signal can be transmitted from the first cable C1 through the pivoting module 33 to the second cable C2. It is required that the first cable C1 is kept in position at the second end 311$b$ and the second cable C2 is kept in position at the fourth end 321$b$. It is also required that the antenna carrier 20 is moved smoothly along the circularly curved frame body under the action of the multi-link structure that has the first cable carrying arm 31 and the second cable carrying arm 32 pivoted together. In order to meet the above requirements, the pivoting module 33 is disposed in the second axis L2 in this embodiment.

Further, to avoid any interference with the probe antenna, the pivoting module 33 is disposed away from the circular center O of the frame body 11 at a predetermined distance. That is, the pivoting module 33 is disposed away from the plane on which the frame body 11 is disposed. The second end 311$b$ of the first cable carrying arm 31 and the fourth end 321$b$ of the second cable carrying arm 32 are disposed on the plane on which the frame body 11 is disposed. In this embodiment, therefore, the first main body 311 of the first cable carrying arm 31 is formed to have a plurality of first bending portions 315, the second main body 321 of the second cable carrying arm 32 is formed to have a plurality of second bending portions 325, and the second bending angle of the second bending portion 325 is greater than the first bending angle of the first bending portion 315.

The pivoting module 33 includes a mechanically pivoting structure 331 and a first electrically pivoting structure 332. The mechanically pivoting structure 31 is connected to the first connecting portion 312 of the first cable carrying arm 31 and the second connecting portion 322 of the second cable carrying arm 32. The first connecting portion 312 and the second connecting portion 322 are rotatable with respect to each other through the mechanically pivoting structure 331.

In this embodiment, the mechanically pivoting structure 331 includes a bearing 3311 and a connecting element 3312. The bearing 3311 includes an inner ring 3311$a$ and an outer ring 3311$b$. The inner ring 3311$a$ and the outer ring 3311$b$ can be rotated with respect to each other by means of balls or rollers provided therebetween. The outer ring 3311$b$ is connected to the first connecting portion 312. The inner ring 3311$a$ is connected to the connecting element 3312 and the second connecting portion 322. Therefore, the connecting element 3312 is rotated together with the inner ring 3311$a$ and the second connecting portion 322 synchronously. The first connecting portion 312 of the first cable carrying arm 31 and the second connecting portion 322 of the second cable carrying arm 32 are rotatably connected through the bearing 3311 so as to perform a mechanical connection therebetween.

The connecting element 3312 is substantially cylindrical and has flanges at both ends which respectively connect the inner ring 3311$a$ of the bearing 3311 and the second connecting portion 322 of the second cable carrying arm 32. The connecting element 3312 further has an inner space in which the first electrically pivoting structure 332 is disposed. The first cable C1 and the second cable C2 are connected by the first electrically pivoting structure 332 and therefore can be rotated with respect to each other without bending and twisting.

The first electrically pivoting structure 332 includes a first electrical connector 3321, a second electrical connector 3322 and a rotatable coupler 3323. The rotatable coupler 3323 includes a coupler body 3323$a$, a first protruding end 3323$b$ and a second protruding end 3323$c$. The first protruding end 3323$b$ and the second protruding end 3323$c$ are extended from the coupler body 3323$a$ in opposite directions. The coupler body 3323$a$ is disposed at the second connecting portion 322 to rotate together with the second connecting portion 322. The first electrical connector 3321 is connected to the first cable C1 and is rotatably coupled to the first protruding end 3323$b$. The second electrical connector 3322 is connected to the second cable C2 and is rotatably coupled to the second protruding end 3323$c$. In this embodiment, the first electrical connector 3321 and the second electrical connector 3322 are coaxial connectors. The first electrical connector 3321 and the second electrical connector 3322 can be rotated with respect to each other via the rotatable coupler 3323. By such arrangement, the first cable C1 and the second cable C2 can be rotated with respect to each other without deformation (bending, twisting and so on).

The first cable carrying arm 31 is configured to further carry a third cable C3. The second cable carrying arm 32 is configured to further carry a fourth cable C4. The third cable C3 and the fourth cable C4 are configured to transmit the control signal of the second driving device 50. The third cable C3 is disposed in the first cable channel 313. The fourth cable C4 is disposed in the second cable channel 323. The pivoting module further includes a second electrically pivoting structure 333. The second electrically pivoting structure 333 is electrically connected to the third cable C3 and the fourth cable C4 so that the third cable C3 and the fourth cable C4 can be rotated with respect to each other.

The second electrically pivoting structure 333 includes a stator portion 3331, a rotor portion 3332 and a rotor connecting element 3333. The rotor portion 3332 and the stator portion 3331 are coaxially arranged and rotatably connected to each other. Further, the rotor portion 3332 and the stator portion 3331 are electrically connected to each other. The stator portion 3331 is fixed to the first connecting portion 312 of the first cable carrying arm 31 through a fixing bracket 3331$a$. The rotor connecting element 3333 is fixed to the second connecting portion 322 of the second cable carrying arm 32. The rotor portion 3332 is connected to the second connecting portion 322 through the rotor connecting portion 3333. The rotor portion 3332 and the stator portion 3331 have an abutting structure disposed therebetween. The abutting structure includes an elastic piece disposed against the rotor portion 3332 or the stator portion 3331 so that the rotor portion 3332 and the stator portion 3331 are kept in an electrical connection during rotation. In this embodiment, the second electrically pivoting structure 333 further includes a circuit board 3334 and a third electrical connector 3335 disposed on the circuit board 3334. The circuit board 3334 is fixed to the second connecting portion 322 of the second cable carrying arm 32. The fourth cable C4 is connected to the third electrical connector 3335. The third electrical connector 3335 has terminals electrically connected to the rotor portion 3332 through a lead wire.

Through the second electrically pivoting structure 333, the third cable C3 and the stator portion 3331 are electrically connected and the fourth cable C4 and the rotor portion 3332 are electrically connected. The arrangement ensures that the third cable C3 and the fourth cable C4 are kept in an electrical connection during rotation. Similar to the first cable C1 and the second cable C2, the third cable C3 and the fourth cable C4 can be kept in position in the first cable carrying arm 31 and the second cable carrying arm 32 without any deformation (bending, twisting and so on).

In the spherical scanning type antenna measurement system and the signal transmission mechanism of the invention, the first cable carrying arm that carries the first cable and the second cable carrying arm that carries the second cable are rotatably connected through the pivoting module. By such arrangement, the first cable and the second cable can be kept in the first cable carrying arm and the second cable carrying arm when the antenna carrier is moved along the frame body of the measurement frame at the circularly curved trajectory. Further, the first cable and the second cable are electrically connected through the pivoting module. By means of the pivoting module, the signal is transmitted between the first cable and the second cable. Therefore, the signal will not be distorted during transmission, and the measurement of the antenna characters is precise.

The above is only the preferred embodiment of the invention, and the scope of the invention is not limited thereto. That is, the simple equivalent changes and modifications made according to the description of the invention and the claims are all within the scope of the invention. Further, any one of the embodiments or claims is not required to achieve all the objects or advantages or features of the invention. Further, the abstract and title are only used to assist in the search of patent documents and are not intended to limit the scope of the invention. Further, the terms "first" and "second" described in the specification and claims are only used to distinguish between different elements, embodiments or scopes, without limiting the quantity of the elements with an upper limit or a lower limit.

What is claimed is:

1. A signal transmission mechanism, comprising:
   a first cable carrying arm comprising a first main body and a first connecting portion wherein the first main body comprises a first end and a second end, and the first connecting portion is disposed at the first end;
   a second cable carrying arm comprising a second main body and a second connecting portion wherein the second main body comprises a third end and a fourth end, and the second connecting portion is disposed at the third end;
   a pivoting module connected to the first connecting portion and the second connecting portion so that the first cable carrying arm and the second cable carrying arm can be rotated with respect to each other;
   wherein the first cable carrying arm is configured to carry a first cable and the second cable carrying arm is configured to carry a second cable;
   wherein the first cable and the second cable are electrically connected through the pivoting module;
   wherein a signal is transmitted from the first cable through the pivoting module to the second cable;
   wherein the first cable and the second cable are not deformed when the first cable carrying arm and the second cable carrying arm are rotated with respect to each other.

2. The signal transmission mechanism as claimed in claim 1, wherein the second end of the first cable carrying arm is fixedly disposed, and the fourth end of the second cable carrying arm is movable at a linear trajectory or at a curved trajectory.

3. The signal transmission mechanism as claimed in claim 1, wherein:
   the pivoting module comprises a mechanically pivoting structure and a first electrically pivoting structure;
   the first connecting portion and the second connecting portion are rotatably connected through the mechanically pivoting structure;
   the first cable and the second cable are rotatably connected through the first electrically pivoting structure.

4. The signal transmission mechanism as claimed in claim 3, wherein:
   the mechanically pivoting structure comprises a bearing;
   the bearing comprises an inner ring and an outer ring;
   the outer ring is connected to the first connecting portion;
   the inner ring is connected to the second connecting portion.

5. The signal transmission mechanism as claimed in claim 4, wherein:
   the mechanically pivoting structure further comprises a connecting element;
   the connecting element connects the inner ring of the bearing and the second connecting portion so that the connecting element is rotated together with the inner ring of the bearing and the second connecting portion synchronously;
   the connecting element comprises an inner space in which the first electrically pivoting structure is disposed.

6. The signal transmission mechanism as claimed in claim 3, wherein:
   the first electrically pivoting structure comprises a first electrical connector, a second electrical connector and a rotatable coupler;
   the rotatable coupler comprises a coupler body, a first protruding end and a second protruding end;
   the first protruding end and the second protruding end are extended from the coupler body in opposite directions;
   the coupler body is disposed at the second connecting portion;
   the first electrical connector is connected to the first cable and is rotatably coupled to the first protruding end;
   the second electrical connector is connected to the second cable and is rotatably coupled to the second protruding end.

7. The signal transmission mechanism as claimed in claim 1, wherein:
   the first cable carrying arm comprises a first cable channel to contain the first cable;
   the first cable channel is connected to the first connecting portion;
   the second cable carrying arm comprises a second cable channel to contain the second cable;
   the second cable channel is connected to the second connecting portion.

8. A spherical scanning type antenna measurement system, comprising:
   a measurement frame comprises a frame body and a pivot portion;
   an antenna carrier configured to carry an antenna and movably disposed on the frame body of the measurement frame;
   the signal transmission mechanism of claim 1 wherein the second end of the first cable carrying arm is fixed to the measurement frame and the fourth end of the second cable carrying arm is connected to the antenna carrier;
   wherein the frame body is circularly curved and is disposed corresponding to a circular center, and the pivot portion is connected to the frame body;
   wherein the pivot portion is rotatable about a first axis;
   wherein a second axis is configured to pass through the circular center and is disposed perpendicular to the frame body;
   wherein the first axis and the second axis are perpendicular to each other and intersect at the circular center;

wherein the antenna carrier is movable along the frame body at a circularly curved trajectory.

9. The spherical scanning type antenna measurement system as claimed in claim 8, wherein the pivoting module of the signal transmission mechanism is disposed in the second axis.

10. The spherical scanning type antenna measurement system as claimed in claim 8, further comprising a stand disposed on a base plane, wherein the pivot portion of the measurement frame is rotatably connected to the stand, and the first axis is disposed in parallel to the base plane.

\* \* \* \* \*